(12) United States Patent
Pschenitzka

(10) Patent No.: US 9,763,313 B2
(45) Date of Patent: Sep. 12, 2017

(54) CONDUCTIVE NANOSTRUCTURE-BASED FILMS WITH IMPROVED ESD PERFORMANCE

(71) Applicant: CHAMP GREAT INT'L CORPORATION, Eden Island (SC)

(72) Inventor: Florian Pschenitzka, San Francisco, CA (US)

(73) Assignee: CAM Holding Corporation, Tortola (VG)

( * ) Notice: Subject to any disclaimer, the term of this patent is extended or adjusted under 35 U.S.C. 154(b) by 569 days.

(21) Appl. No.: 14/260,888

(22) Filed: Apr. 24, 2014

(65) Prior Publication Data

US 2014/0340811 A1    Nov. 20, 2014

Related U.S. Application Data

(60) Provisional application No. 61/823,833, filed on May 15, 2013.

(51) Int. Cl.

| | |
|---|---|
| *H05F 1/02* | (2006.01) |
| *H05K 1/02* | (2006.01) |
| *G02B 1/16* | (2015.01) |
| *G02B 1/10* | (2015.01) |

(Continued)

(52) U.S. Cl.
CPC .............. *H05F 1/02* (2013.01); *G02B 1/105* (2013.01); *G02B 1/16* (2015.01); *H05K 1/0259* (2013.01); *B82Y 10/00* (2013.01); *H05K 1/0234* (2013.01); *H05K 1/0274* (2013.01); *H05K 1/095* (2013.01);

(Continued)

(58) Field of Classification Search
CPC .......... H05F 1/02; G02B 1/105; H05K 1/0259
See application file for complete search history.

(56) References Cited

U.S. PATENT DOCUMENTS

| | | | | |
|---|---|---|---|---|
| 2005/0269936 | A1* | 12/2005 | Takada | H01J 1/316 313/495 |
| 2007/0278448 | A1* | 12/2007 | Chari | B82Y 20/00 252/299.01 |
| 2009/0052029 | A1 | 2/2009 | Dai et al. | |

(Continued)

FOREIGN PATENT DOCUMENTS

WO    2012/145157 A1    10/2012

OTHER PUBLICATIONS

Hu, L. et al., "Metal nanogrids, nanowires, and nanofibers for transparent electrodes", MRS Bulletin, vol. 36, No. 10, Oct. 2011, pp. 760-765.

(Continued)

*Primary Examiner* — Thienvu Tran
*Assistant Examiner* — Tien Mai
(74) *Attorney, Agent, or Firm* — Paul Bendemire

(57) ABSTRACT

Optical stacks containing one or more patterned transparent conductor layers may be damaged by electrostatic discharges that occur during the optical stack manufacturing process. Such damage may result in non-conductive conductors within the patterned transparent conductor layer. An electrostatic discharge protected optical stack may include a substrate layer, a first anti-static layer having a sheet resistance of from about $10^6$ ohms per square ($\Omega$/sq) to about $10^9$ $\Omega$/sq, and a patterned transparent conductor layer. Methods of testing and assessing damage to patterned transparent conductors are provided.

5 Claims, 9 Drawing Sheets

(51) Int. Cl.
   *H05K 1/09*      (2006.01)
   *B82Y 10/00*     (2011.01)
(52) U.S. Cl.
   CPC ............... *H05K 2201/0108* (2013.01); *H05K 2201/0281* (2013.01); *Y10T 29/49117* (2015.01)

(56) References Cited

U.S. PATENT DOCUMENTS

| | | |
|---|---|---|
| 2010/0243295 A1 | 9/2010 | Allemand et al. |
| 2011/0003279 A1* | 1/2011 | Patel ................. G01D 3/10 435/5 |
| 2012/0048609 A1* | 3/2012 | Ohnuki ................ G11B 5/486 174/260 |
| 2012/0058302 A1* | 3/2012 | Eggenspieler ......... B01D 65/08 428/141 |
| 2012/0103660 A1 | 5/2012 | Gupta et al. |
| 2014/0158400 A1 | 6/2014 | Wolk et al. |

OTHER PUBLICATIONS

Jones et al., "Two-Sided Laser Patterning on Thin Film Substrates," U.S. Appl. No. 14/161,310, filed Jan. 22, 2014, 30 pages.
Pothoven, "Laser Patterning of Silver Nanowire," *Information Display Magazine* 28(9):10 pages, Sep. 2012.

* cited by examiner

CONDUCTIVE NANOSTRUCTURE-BASED FILMS WITH IMPROVED ESD PERFORMANCE

BACKGROUND

Technical Field

This invention relates to optical stacks including one or more transparent conductors, and in particular to protecting such optical stacks from damaging electrostatic discharges.

Description of the Related Art

Optical stacks are used in applications requiring optical clarity and transparency, such as touch sensitive display surfaces where electrical conductivity is needed for touch sensitivity and optical clarity is needed for display clarity. Frequently, such optical stacks include a number of layers that include a substrate layer, a transparent conductor layer, and a protective overcoat layer. Optical stacks are manufactured using various manufacturing processes, including roll-to-roll production in the form of a continuous film.

Despite proper grounding of the roll-to-roll production equipment, it is possible for damaging levels of electrostatic charge to build up on or within the optical stack during production. Such electrostatic charges can propagate through the transparent conductor layer of the optical stack, causing structural damage to the transparent conductor layer if the resulting electrical current is too high.

Accordingly, there remains a need in the art to prevent the formation of damaging levels of electrostatic charge in optical stacks containing transparent conductors and/or to dissipate or mitigate the effects of damaging levels of electrostatic charge within an optical stack without damaging the transparent conductors within the optical stack.

BRIEF SUMMARY

An optical stack may include one or more transparent conductors. Transparent conductors incorporate a variety of materials, compounds, and compositions that include indium tin oxide (ITO) and low sheet resistance grids and/or conductive nanostructures that may or may not be dispersed or otherwise suspended in a polymeric binder, and metallic nanostructures that may or may not be dispersed or otherwise suspended in a polymeric binder, and combinations thereof. A transparent conductor may be deposited on a substrate using any of a number of deposition techniques familiar to those of skill in the art. At times, the transparent conductor layer may be patterned for example via laser patterning or wet etching. In some instances, the transparent conductor layer may be pre-patterned, for example deposited as a liquid transparent conductor solution, ink, or suspension in a pattern formed on the substrate. In other instances, the transparent conductor layer may be post-patterned, for example by the selective removal of portions of a continuous transparent conductor layer. In optical stacks containing patterned transparent conductor layers, there exists a risk of an electrostatic discharge causing a current density sufficient to damage portions of the patterned transparent conductor structure.

The relatively high voltage of an electrostatic discharge can induce a near instantaneous, relatively large, current density in some or all of the patterned transparent conductor structures. Thermal damage occurs to the transparent conductor structures subjected to this large current. At times, the thermal damage is sufficient to cause the patterned transparent conductor structures to disintegrate, thereby disrupting the continuity of all or a portion of the patterned transparent conductor layer. Such electrostatic discharge events occur when charge accumulation near a patterned transparent conductor reach a level sufficient to arc from the charge carrying surface to the transparent conductor or vice versa. When the charge accumulation reaches a level sufficient to arc, the accumulated charge travels towards a lower energy potential that is created by: grounding the patterned transparent conductor, or grounding an electrode in close proximity to the patterned transparent conductor.

Grounding an electrode positioned closely proximate to the patterned transparent conductor generally results in less damage to the patterned transparent conductor due to fact that the current is limited by the capacitance provided by the closely proximate electrodes. On the other hand, direct grounding of the patterned transparent conductor causes a larger voltage differential increasing the power dissipated through the patterned transparent conductor.

The threat of irreparable damage to patterned transparent conductors from electrostatic discharge caused by grounding of the patterned transparent conductors in the production or manufacturing process (e.g., during roll-to-roll production) may be reduced by incorporating one or more anti-static or static reducing layers in the optical stack during the production process. The use of such anti-static or static reducing layers beneficially reduces areas of charge accumulation within the optical stack film during the production process. By providing a slightly conductive pathway to avoid charge build-up throughout the optical stack film, the risk of electrostatic discharges is reduced or eliminated. Although the risk of an externally triggered electrostatic discharge event still exists (e.g., by placing a charged tool or charged skin surface proximate the optical stack film) the danger presented by such externally triggered events may be minimized by taking precautions such as adoption of appropriate static reduction devices and construction techniques.

The anti-static or static reducing layer may include the use of an anti-static substrate having a marginally or slightly conductive coating applied to either or both sides of the substrate. The sheet resistance of such anti-static or static reducing substrates is generally in the range of from about $10^6$ ohms per square ($\Omega$/sq) to about $10^9$ $\Omega$/sq.

Examples of electrostatic discharge (ESD) protected optical stack may include a substrate layer, at least one anti-static layer, and at least one transparent conductor layer. While many different optical stack physical configurations exist, in general they may be categorized as follows:

a) Configurations in which the anti-static layer provides an undercoat to the patterned transparent conductor layer. For example, an optical stack may be constructed as a substrate layer, a first anti-static layer having a sheet resistance of from about $10^6$ ohms per square ($\Omega$/sq) to about $10^9$ $\Omega$/sq deposited onto the substrate layer, and a patterned transparent conductor layer with a much lower sheet resistance (e.g., less than $10^4$ $\Omega$/sq) than the anti-static layer deposited onto the underlying anti-static layer;

b) Configurations in which the anti-static layer provides an overcoat to the patterned transparent conductor layer. For example, an optical stack may be constructed as a substrate layer with a patterned transparent conductor layer deposited onto the substrate layer, and a first anti-static layer having a sheet resistance of from about $10^6$ ohms per square ($\Omega$/sq) to about $10^9$ $\Omega$/sq deposited onto the underlying transparent conductor layer;

c) Configurations in which the anti-static layer is deposited on the side of the substrate opposite the patterned transparent conductor layer. For example, an optical stack may be constructed as a substrate layer with an anti-static layer deposited onto the substrate layer laterally opposite the patterned transparent conductor layer. This configuration is combinable with either configuration described in (a) and (b) above.

At times, the patterned transparent conductor layer may include transparent conductive metal oxide compounds, such as indium tin oxide or "ITO," a low sheet resistance grid and/or conductive nanostructures such as metallic nanowires. An example conductive nanostructure includes silver nanowires having a diameter of from about 5 nanometers to about 60 nanometers and a length of from about 5 microns to about 50 microns dispersed in a polymeric binder. In configurations where the anti-static layer provides an overcoat to the patterned transparent conductor, the method may include patterning the transparent conductor layer with or without penetrating through the first anti-static layer. In configurations where the anti-static layer provides an undercoat for the transparent conductor, the method includes depositing a substantially transparent overcoat layer over the patterned transparent conductor layer to protect the patterned transparent conductor layer. This overcoat layer may or may not have anti-static properties.

Another illustrative method of limiting electrical charge concentration in an optical stack may include depositing a transparent conductor layer proximate at least a portion of a substrate layer and patterning the deposited transparent conductor layer to provide a patterned transparent conductor layer. The method may further include depositing a first anti-static layer proximate at least a portion of the patterned transparent conductor layer laterally opposite the substrate layer. The first anti-static layer can be marginally conductive, for example having a sheet resistance of from about $10^6$ ohms per square ($\Omega$/sq) to about $10^9$ $\Omega$/sq. The method may optionally include depositing a substantially transparent overcoat layer across at least a portion of the first anti-static layer laterally opposite the patterned transparent conductor layer. The method may further optionally include depositing a second anti-static layer proximate the substrate layer laterally opposite the patterned transparent conductor layer. The second anti-static layer can be marginally conductive, for example having a sheet resistance of from about $10^6$ ohms per square ($\Omega$/sq) to about $10^9$ $\Omega$/sq.

A method of assessing the effects of electrostatic discharge and charge accumulation on a patterned transparent conductor may include the placement of the substrate layer proximate at least a portion of a grounded counter electrode and depositing a transparent conductor layer at least partially laterally opposite the grounded counter electrode. The method also includes deposition of charging inlets on a side of the substrate layer occupied by the patterned transparent conductor layer at a first location not in direct physical contact with either the patterned transparent. The method additionally includes disposing a drain outlet proximate the anti-static substrate layer on the same side of the substrate as the charging inlets located at a second location not in direct physical contact with patterned transparent conductor wherein at least a portion of the patterned transparent conductor physically interposes between the first location and the second location. The drain outlets are electrically coupled to the grounded counter electrode. The effects of a charge accumulation proximate or near the patterned transparent conductor layer may be assessed by electrically coupling an charge storage device (e.g. charged capacitor) to the charging inlet and permitting the accumulated charge to dissipate and/or discharge through the patterned transparent conductor and/or the anti-static layer. The method includes accumulating electrical charge at the charging inlet and determining the effect of the resulting current dissipation and/or discharge on all or a portion of the patterned transparent conductor.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been selected solely for ease of recognition in the drawings.

DETAILED DESCRIPTION

Figure 1A:
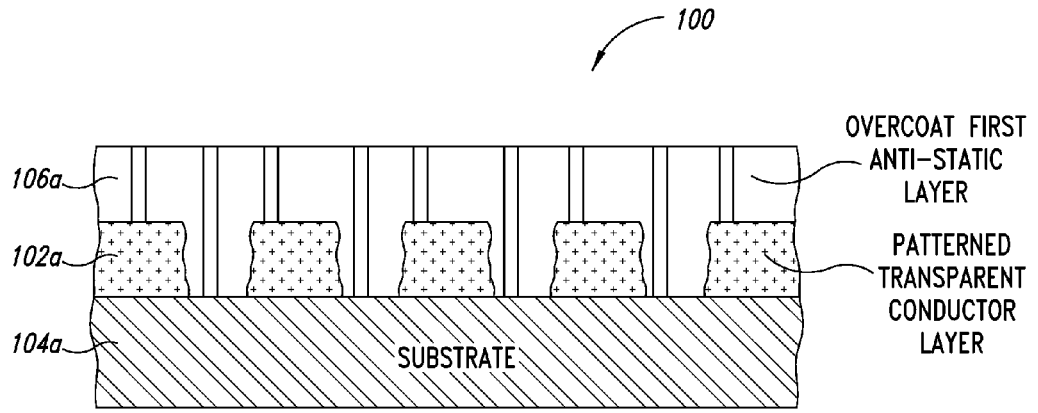
FIGS. 1A and 1B depict cross-sections of an illustrative optical stack including a substrate layer, a patterned transparent conductor layer, and a first anti-static layer overcoat, according to embodiments described herein.

The optical stacks and methods described herein are presented in the form of various embodiments. It should be understood that variations are possible within each of these embodiments and in other embodiments not specifically described for the sake of clarity and/or to avoid redundancy within this disclosure. Additionally, the order, extent, and composition of the various layers and structures disclosed herein can be varied, altered, divided, or subdivided to meet varying performance specifications.

The terms top, bottom, left, and right as used herein denote relative and not absolute orientations. Thus a structure that in one embodiment has layer "A" identified as a "top" layer may, in a second embodiment, be inverted such that layer "A" is now identified as a "bottom" layer in the structure. Such re-oriented, repositioned, and/or rotated embodiments are included in the scope of the following disclosure.

The optical stacks described herein include structures containing a number of layers. To ease discussion and aid in clarity the terms "laterally opposed" and "laterally opposite" are used to describe the relative positions of various layers with respect to each other. Thus, considering a structure including three proximately disposed layers in which layer "A" forms a top layer, layer "B" forms an intermediate layer, and layer "C" forms a bottom layer, layer "A" may be described as proximate layer "B" laterally opposed to or laterally opposite from layer "C." Similarly, layer "C" may be described as proximate layer "B" laterally opposed to or laterally opposite from layer "A."

As used herein the term "patterned transparent conductor" and "patterned transparent conductor layer" refers to any transparent conductor construction having a defined physical arrangement or pattern of transparent conductive structures. Transparent conductors may include any current or future developed conductive material having acceptably transparent optical properties and a sheet resistance of less than $10^4$ ohms/square ($\Omega$/sq). Example transparent conductors include ITO, low sheet resistance grids embedded or otherwise encapsulated in a binder, conductive nanostructures embedded or otherwise encapsulated in a binder, or combinations thereof (e.g., a low sheet resistance grid and conductive nanostructures dispersed, embedded, or encapsulated in a binder).

An example patterned transparent conductor is described in U.S. patent application Ser. No. 13/791,086, filed Mar. 8, 2013, which is incorporated by reference as if reproduced in its entirety herein to the extent the material disclosed is consistent with the subject matter disclosed herein. At times, a patterned transparent conductor and/or patterned transparent conductor layer includes a plurality of individual, physically isolated conductive structures. In such instances, the individual transparent conductors may be separated by intervening or interposed gaps, spaces, or similar voids that may or may not incorporate an electrically insulative substance or material having a sheet resistance in excess of $10^6$ $\Omega$/sq. At times, the patterned transparent conductor may be formed by the deposition of spaced or otherwise separated individual transparent conductors on a substrate.

At other times, the patterned transparent conductor may be formed by removing a portion of a continuous or semi-continuous transparent conductor to provide a defined pattern of transparent conductors separated by gaps, intervening spaces, or voids. Wet etching is an example patterning technique. Another example patterning technique includes laser ablation such as that described in "Laser Patterning of Silver Nanowire" (Terry Pothoven, *Laser Patterning of Silver Nanowire*, INFORMATION DISPLAY MAGAZINE, Touch and Display Enhancement Issue, September 2012 Vol. 28, No. 09) and in U.S. patent application Ser. No. 14/161,310, filed Jan. 22, 2014, that are incorporated by reference as if reproduced in its entirety herein to the extent the material disclosed therein is consistent with the subject matter disclosed herein. Another example patterning technique includes etching such as that described in U.S. Patent Application Pub. No.: 2010/0243295, filed Feb. 24, 2010, which is incorporated by reference as if reproduced in its entirety herein to the extent the material disclosed therein is consistent with the subject matter disclosed herein.

As used herein, the term "continuous" and layers that are referred to as "continuous" refer to unpatterned layers that are deposited on an underlying substrate or underlying layer in a uniform or near-uniform, uninterrupted, layer. An example continuous layer may include an unpatterned transparent conductor layer uniformly applied to an underlying substrate.

As used herein, the term "anti-static layer" refers to a layer that includes one or more materials or combinations and provides a sheet resistance between $10^6$ ohms/sq and $10^9$ ohms/sq this providing a uniform slight conductivity without interfering with the transparent conductor which has a much lower sheet resistance.

Figure 1B:
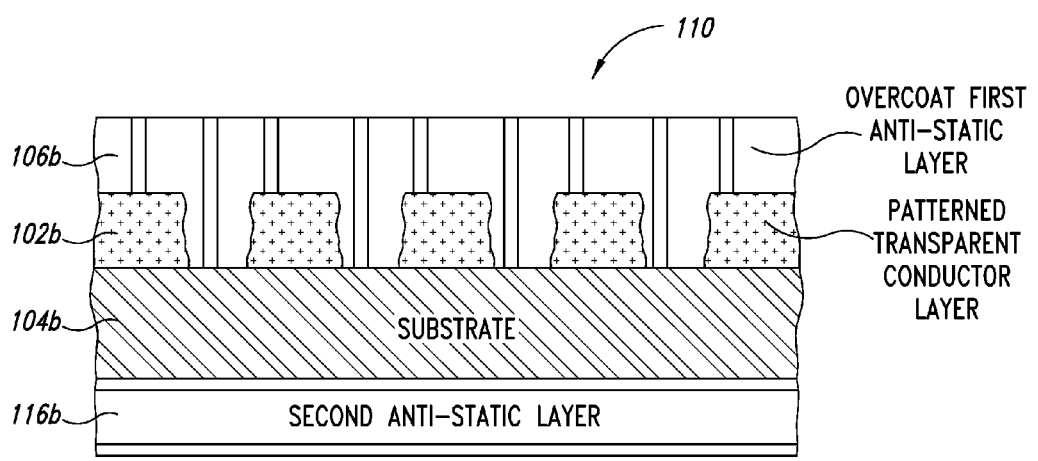

In the following discussion of example optical stack structures, the alphabetic suffix to reference numbers corresponds to the respective alphabetic suffix used in the figures. Thus, the overcoat first anti-static layer in FIG. 1A is labeled with reference number 106a and the overcoat first anti-static layer in FIG. 1B is labeled with reference number 106b. Collectively, such components may be referred to in discussions without use of the alphabetic suffix, thus the overcoat first anti-static layer in FIGS. 1A and 1B would be collectively referred to as the "overcoat anti-static layer 106." Similarly, the patterned transparent conductor layer in FIGS. 1A-1F may be collectively referred to as the "patterned transparent conductor layer 102."

FIG. 1A depicts a cross-section of an illustrative optical stack 100 that includes a patterned transparent conductor layer 102a deposited between a substrate layer 104a and an overcoat first anti-static layer 106a that has been applied over the patterned transparent conductor layer 102a, according to one illustrated embodiment. The optical stack 100 may be formed using any known or future developed technology, including roll-to-roll processing.

The patterned transparent conductor layer 102 may be formed or otherwise deposited on the substrate layer 104 using any known or future developed deposition technology including spray deposition, printing, and the like. In some instances, the patterned transparent conductor layer 102 is deposited in final form on the substrate layer 102, for example using an ink deposited using a print head or similar deposition technology. In other instances, the patterned transparent conductor layer 102 is deposited as a continuous layer that is patterned subsequent to deposition on the substrate 104. Such patterning may be accomplished using any known or future developed patterning technology and/or technique including laser patterning (e.g., laser ablation) or wet etching.

In some implementations, the patterned transparent conductor layer 102 can include any current or future developed transparent conductive material having acceptable optical characteristics and capable of providing a sheet resistance of less than $10^4$ Ω/sq. For example, the patterned transparent conductor layer 102 may include a transparent conductor such as indium tin oxide. In another example, the patterned transparent conductor layer 102 may include one or more electrically conductive structures (e.g., low sheet resistance grid) one or more electrically conductive nanostructures (e.g., metallic nanowires), or combinations thereof. Such electrically conductive structures and/or electrically conductive nanostructures may include one or more metals and/or metal alloys in the form of metallic nanostructures including metallic nanowires. Example metals include, but are not limited to silver, gold, and platinum, or alloys, compounds or mixtures thereof. In addition to or alternative to metallic nanowires, the patterned transparent conductor layer 102 may include metallic nanostructures having one or more nanostructure forms. Example nanostructure forms include, but are not limited to: nanowires, nanotubes, nanodots, and similar solid, semisolid, or tubular/hollow nanostructures, or combinations thereof. The patterned transparent conductor layer 102 may include a plurality of silver nanowires having a diameter of from about 10 nanometers to about 100 nanometers; about 10 nanometers to about 80 nanometers; or about 10 nanometers to about 60 nanometers. The patterned transparent conductor layer 102 may include a plurality of silver nanowires having a length of from about 1 micron to about 50 microns; about 2 microns to about 40 microns; or about 5 microns to about 30 microns.

In some implementations, the patterned transparent conductor layer 102 may be deposited on an undercoat layer, such as a substrate layer 104 or undercoat first anti-static layer 106. In such implementations, the patterned transparent conductor layer 102 may be deposited as a liquid solution or nanostructure containing ink that includes the metallic nanostructures and a liquid carrier using any current or future developed batch and/or continuous processes capable of delivering a near or substantially uniform transparent conductor layer on a substrate layer 104 and/or undercoat first anti-static layer 106. Example deposition processes include, but are not limited to spin coating, dip coating, and meniscus coating.

In instances where the patterned transparent conductor 102 includes a low sheet resistance grid and/or conductive nanostructures, such low sheet resistance grids and/or conductive nanostructures may be at least partially embedded or at least partially encapsulated in an optically clear polymeric binder. A binder is considered optically clear if the light transmission of the polymerized binder is at least 80% in the visible region (400 nm-700 nm). The optical clarity of the binder is typically determined by a multitude of factors, including without limitation: the refractive index (RI), thickness, consistency of RI throughout the thickness, surface (including interface) reflection, and haze (a scattering loss caused by surface roughness and/or embedded particles). In certain embodiments, the polymerized binder, and hence the patterned transparent conductor layer 102 is about 10 nanometers (nm) to 5 micrometers (μm) thick, about 20 nm to 1 μm thick, or about 20 nm to 200 nm thick. In other embodiments, the polymerized binder has a refractive index of about 1.3 to 2.5, or about 1.35 to 1.8.

At times, the transparent conductor layer 102 may include one or more low sheet resistance (e.g., metal) grids and/or conductive (e.g., metallic) nanostructures that are suspended, embedded, encapsulated, or otherwise dispersed in a polymeric binder. In such instances, the binder may include one or more inorganic binders such as silica, mullite, alumina, SiC, MgO—$Al_2O_3$—$SiO_2$, $Al_2O_3$—$SiO_2$, MgO—$Al_2O_3$—$SiO_2$—$Li_2O$ or mixtures thereof. In such instances, the binder may include one or more conductive materials, thereby imparting a level of conductivity to the binder itself. For example, the binder can be a conductive polymer. Conductive polymers useful as binders in the transparent conductor layer 102 are well known in the art, including without limitation: poly(3,4-ethylenedioxythiophene) (PEDOT), polyanilines, polythiophenes, polypyroles and polydiacetylenes. In other embodiments, the polymer binder may be a viscosity modifier, which serves as a binder that immobilizes the nanostructures on a substrate. Examples of suitable viscosity modifiers include hydroxypropyl methylcellulose (HPMC), methyl cellulose, ethyl cellulose, xanthan gum, polyvinyl alcohol, carboxy methyl cellulose, and hydroxy ethyl cellulose.

In instances where the patterned transparent conductor layer 102 includes metallic nanowires, the threshold loading level refers to a percentage of the metallic nanowires by weight after loading of the patterned transparent conductor layer 102 at which the conductive elements forming the patterned transparent conductor layer 102 have a sheet resistance of no more than about $10^6$ ohms per square (Ω/sq). The threshold loading level depends on factors such as the aspect ratio, the degree of alignment, degree of agglomeration and the resistivity of the metallic nanowires. In at least some embodiments, all or a portion of the nanowires present in the patterned transparent conductor layer 102 can be aligned to provide one or more desirable electrical properties. Such configurations are described in detail in U.S. application Ser. No. 11/871,721, filed Oct. 12, 2007, entitled "Functional Films Formed by Highly Oriented Deposition of Nanowires" which, to the extent it does not contradict the material presented herein, is incorporated by reference as if reproduced herein in its entirety.

In instances where the patterned transparent conductor includes one or more low sheet resistance grids, the grid(s) assist with the provision of a low resistance pathway or a network of pathways for current flow, distribution and/or collection. In addition to assisting with providing these low resistance pathways, the low sheet resistance grid may also provide a measure of physical strength to the transparent conductor. A transparent conductor having such physical strength may be advantageous for example where larger size transparent conductors are used, for example transparent conductors used in large format OLED displays, OLED lighting devices and photovoltaic devices. Such low sheet resistance grids described in detail in U.S. application Ser. No. 13/287,881, filed Nov. 2, 2011, entitled "Grid and Nanostructure Transparent Conductor for Low Sheet Resistance Applications" which, to the extent it does not contradict the material presented herein, is incorporated by reference as if reproduced herein in its entirety.

The low sheet resistance grid includes any type of electrically conductive structure having appropriate electrical and physical properties, including metallic, non-metallic, or composite structures containing a combination of metallic and non-metallic structures. Examples of low sheet resistance grids include, but are not limited to fine low sheet resistance grid (e.g., copper mesh, silver mesh, aluminum mesh, steel mesh, etc.)—deposited as a screen-printed metal paste (e.g. a silver paste), an embeddable fine metal wire or a printable solution containing one or more residual low resistance components.

The physical size and/or configuration of the low sheet resistance grid is based in whole or in part upon meeting any specified electrical (e.g., sheet resistance) and physical (e.g., surface roughness and/or light transmission) requirements.

In some embodiments, the width of the elements forming the low sheet resistance grid can range from about 1 μm to about 300 μm. In some embodiments, the height of the elements forming the low sheet resistance grid can range from about 100 nm to about 100 μm. The open distance between the elements forming the low sheet resistance grid can range from about 100 μm to about 10 mm.

Deposition of the low sheet resistance grid can be accomplished using pre-patterning, post-patterning or any combination thereof. Examples of pre-patterned, printed, low sheet resistance grids include, but are not limited to, printed silver paste grids, printed copper paste grids, micro- or nano-particle paste grids, or similar conductive paste grids. An example post-patterned low sheet resistance grid may be formed using photolithographic development of a previously applied conductive film to produce the low sheet resistance grid. Other example post-patterned low sheet resistance grids include, but are not limited to, overall deposition via printing, evaporation, sputtering, electro-less or electrolytic plating, or solution processing followed by patterning via photo-lithography, screen printed resist, screen printed etchant, standard etch, laser etch, and adhesive lift off stamp.

The low sheet resistance grid may have any two-dimensional or three-dimensional geometry, shape or configuration needed to achieve a desired sheet resistance while retaining acceptable optical properties. While a greater grid density (i.e., greater low resistance pathway cross sectional area) may reduce the overall sheet resistance of the transparent conductor, a high grid density may increase the opacity of the transparent conductor to unacceptable levels. Thus, the pattern selection and physical properties of the low sheet resistance grid is, at times, may represent a compromise based at least in part upon the minimizing the sheet resistance of the transparent conductor while not increasing the opacity of the transparent conductor to an unacceptable degree.

The low sheet resistance grid can have any fixed, geometric or random pattern capable of providing an acceptable sheet resistance. For example, low sheet resistance grid patterns can include regular or irregular width geometric arrangements such as perpendicular lines, angled lines (e.g., forming a "diamond" pattern), and parallel lines. Other patterns can use curved or arc-shaped conductors to achieve complex patterns having uniform or non-uniform sheet resistance, for example where the transparent conductor is intended for a three dimensional application. Where appropriate, for example in some OLED series interconnected cells and in forming photovoltaic modules, the low sheet resistance grid can be formed using two or more patterns, for example a grid formed using parallel lines bounded by a larger pattern, such as a hexagon or rectangle. In another embodiment, the low sheet resistance grid may be a comb-like structure linking series interconnected thin film photovoltaic stripes.

In various embodiments, the light transmission of the patterned transparent conductor layer 102 is at least 80% and can be as high as 98%. Performance-enhancing layers, such as an adhesive layer, anti-reflective layer, anti-glare layer, may further contribute to reducing the overall light transmission of the patterned transparent conductor layer 102. In various embodiments, the light transmission of the patterned transparent conductor 102 can be at least 50%, at least 60%, at least 70%, or at least 80% and may be as high as at least 91% to 99%.

The substrate layer 104 can include any material capable of providing adequate physical support, having suitable transparency, and having adequate electrical characteristics to support the operation of the patterned transparent conductor layer 102. The substrate layer 104 may include one or more additives or adjuncts to provide one or more desirable physical and/or electrical properties. For example, the substrate layer 104 may include, incorporate, or be combined with one or more anti-static materials or additives. In another example, the substrate layer 104 may include one or more bonded anti-static layers. The substrate layer 104 may include one or more flexible materials suitable for roll-to-roll processing, or other continuous, semi-continuous, or batch processing. The substrate layer 104 may include one or more rigid or semi-rigid materials, for example planar sheets of polymeric materials. The substrate layer 104 may feature a homogeneous construction throughout at least a portion of the substrate layer 104. The substrate layer 104 may include one or more materials such as polyethylene terephthalate (PET). In some instances, the substrate layer 104 may include a film supplied on rolls suitable for roll-to-roll processing, such rolls may have a width of from about 1 meter to about 2 meters. In at least some instances, the substrate layer 104 may have a thickness of from about 50 microns to 300 microns; from about 50 microns to 250 microns; or from about 50 microns to 200 microns.

The overcoat first anti-static layer 106 can include any marginally conductive, suitably transparent, material suitable for use as either an overcoat or an undercoat proximate the patterned transparent conductor layer 102. The overcoat first anti-static layer 106 can have a sheet resistance of from about $10^6$ ohms per square ($\Omega$/sq) to about $10^9$ $\Omega$/sq. In some implementations, the in-plane or in-layer conductivity of the overcoat first anti-static layer 106 can be different from the through-plane or through-layer conductivity of the overcoat first anti-static layer 106.

First Anti-Static Layer as an Overcoat (FIG. 1A)

FIG. 1A depicts an implementation where the overcoat first anti-static layer 106a provides an overcoat applied across the patterned transparent conductor layer 102a, laterally opposite the substrate layer 104a. The use of the overcoat first anti-static layer 106a advantageously reduces processing time and cost associated with the manufacture of the optical stack 100 since one or more anti-static materials, agents, or compounds may be added to a conventional optical stack overcoat material.

However, when the overcoat first anti-static layer 106a serves the dual purpose of an overcoat layer to the patterned transparent conductor layer 102a, the thickness of the overcoat first anti-static layer 106a must be sufficiently thin to permit contact between the patterned transparent conductor layer 102a and external circuitry. At the same time, the sheet resistance of the first anti-static layer 106a should be sufficiently low to provide desirable anti-static properties. Furthermore, when the overcoat first anti-static layer 106a overcoats to the patterned transparent conductor layer 102a, the overcoat first anti-static layer 106a must provide both sufficient physical stability to routine handling and desirable anti-static properties.

First Anti-Static Layer as an Overcoat and a Second Anti-Static Layer on the Opposite Side of the Substrate (FIG. 1B)

FIG. 1B depicts a cross-section of another illustrative optical stack 110 that includes a second anti-static layer 116b proximate the substrate layer of the optical stack depicted in FIG. 1A laterally opposite the patterned transparent conductor layer 102b. Electrostatic discharge may result from the accumulation of a charge on both sides of the substrate layer 104b. In such instances, a second anti-static layer 116b deposited onto the substrate layer 104b, laterally opposite the patterned transparent conductor layer 102b can provide sufficient charge transport to prevent an charge accumulation and thus ESD.

The second anti-static layer 116 can include any marginally conductive material suitable for use as an anti-static layer proximate the substrate layer 104. The second anti-static layer 116 can have a sheet resistance of from about $10^6$ ohms per square ($\Omega$/sq) to about $10^9$ $\Omega$/sq.

Figure 1C:
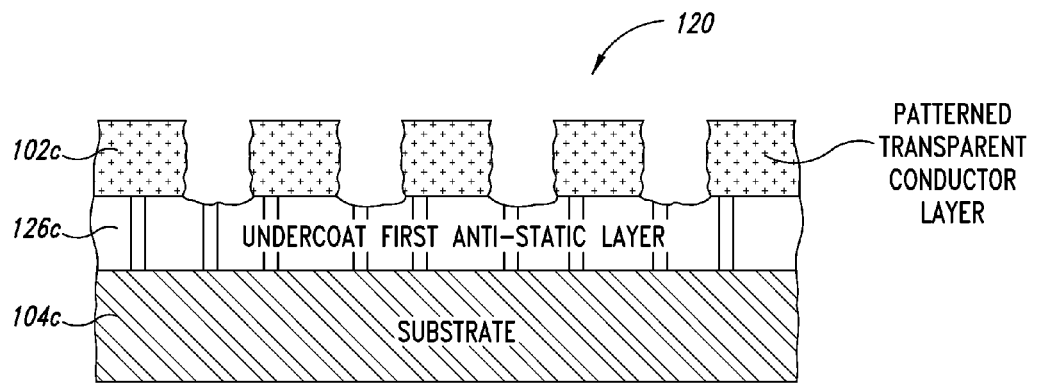
FIGS. 1C, 1D, 1E, and 1F depict cross-sections of an illustrative optical stacks that include a substrate layer, a first anti-static layer undercoat, and a patterned transparent conductor layer, according to embodiments described herein.

First Anti-Static Layer as an Underlayer (FIG. 1C)

FIG. 1C depicts an implementation where an undercoat first anti-static layer 126c is disposed or interposed between the patterned transparent conductor layer 102c and the substrate layer 104c. In such an implementation, the patterned transparent conductor layer 102c may be applied directly as a patterned transparent conductor layer 102c or as a continuous transparent conductor layer that is subsequently patterned using one or more techniques such as laser ablation or wet etching to provide the patterned transparent conductor layer 102c. By controlling the removal of material from the continuous transparent conductor layer, the undercoat first anti-static layer 126c may be advantageously maintained in a physically and electrically continuous state between the patterned transparent conductor layer 102c and the substrate layer 104c.

The undercoat first anti-static layer 126 can include any marginally conductive, suitably transparent, material suitable for use as either an overcoat or an undercoat proximate the patterned transparent conductor layer 102. The undercoat first anti-static layer 126 can have a sheet resistance of from about $10^6$ ohms per square ($\Omega$/sq) to about $10^9$ $\Omega$/sq.

In addition to being more resilient to patterning of an overlaying transparent conductor layer, the use of the undercoat first anti-static layer 126 advantageously permits the use of a much thicker anti-static layer than when the anti-static layer is used as an overcoat. The use of a thicker undercoat first anti-static layer 126 permits the use of a lower bulk conductivity material for the undercoat first anti-static layer 126 while still providing the required surface resistance sufficient for providing an anti-static effect.

Figure 1D:
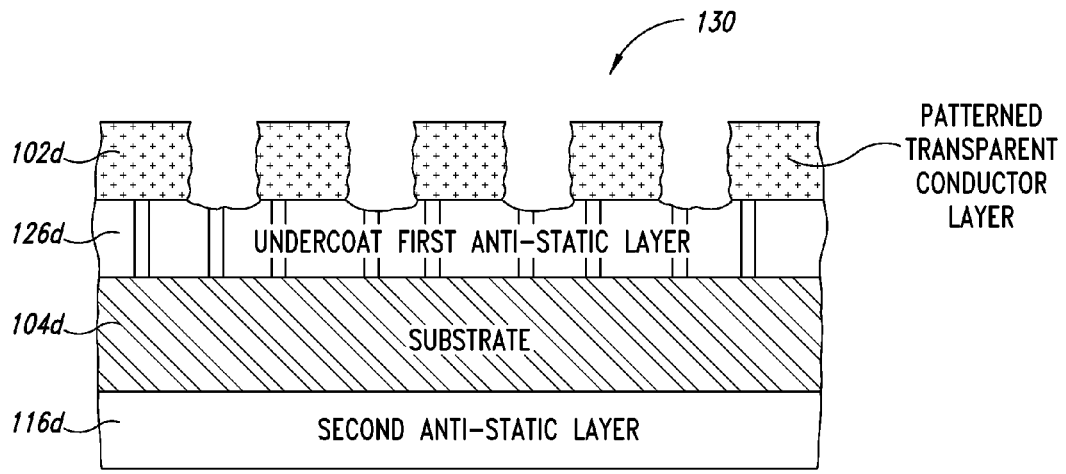

First Anti-Static Layer as an Undercoat+Second Anti-Static Layer on the Opposite Side of the Substrate (FIG. 1D)

FIG. 1D depicts a cross-section of another illustrative optical stack 130 that includes a second anti-static layer 116d proximate the substrate layer 104d laterally opposite the undercoat first anti-static layer 126d. Electrostatic discharge may result from the accumulation of a charge on both sides of the substrate layer 104d. In such instances, a second anti-static layer 116d deposited onto the substrate layer 104d, laterally opposite the undercoat first anti-static layer 126d can provide sufficient charge transport to prevent a charge accumulation and thus electrostatic discharge.

Figure 1E:
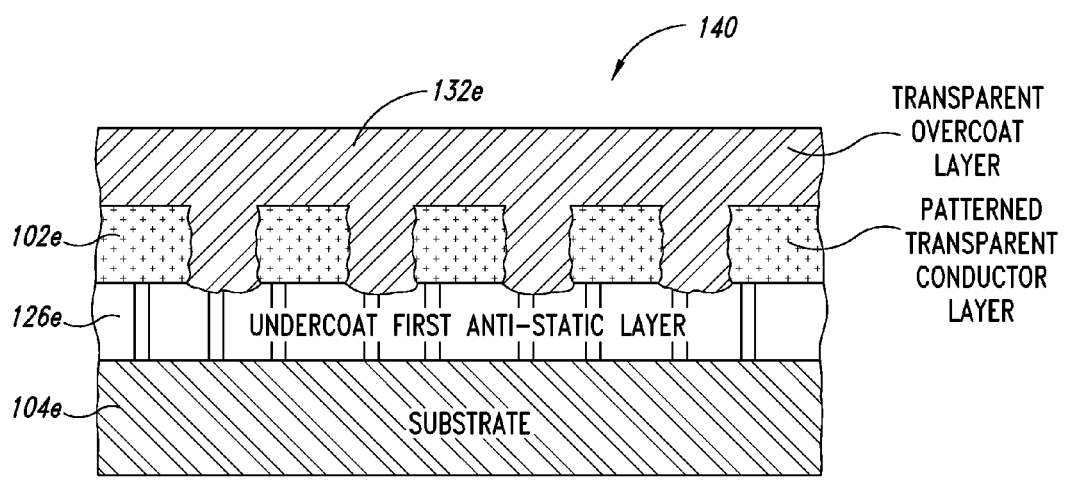

First Anti-Static Layer as an Undercoat+Transparent Overcoat Layer (FIG. 1E)

FIG. 1E depicts a cross-section of another illustrative optical stack 140 that includes a second anti-static layer 116e proximate the substrate layer 104e laterally opposite the undercoat first anti-static layer 126e. A transparent overcoat layer 132e covers the patterned transparent conductor layer 102e and the undercoat first anti-static layer 126e.

The transparent overcoat layer 106 may include one or more polymers or polymeric compounds. Optically clear polymer overcoats 106 are known in the art. Examples of suitable polymeric overcoats 106 include, but are not limited to: polyacrylics such as polymethacrylates (e.g., poly(methyl methacrylate)), polyacrylates and polyacrylonitriles, polyvinyl alcohols, polyesters (e.g., polyethylene terephthalate (PET), polyester naphthalate, and polycarbonates), polymers with a high degree of aromaticity such as phenolics or cresol-formaldehyde (Novolacs®), polystyrenes, polyvinyltoluene, polyvinylxylene, polyimides, polyamides, polyamideimides, polyetheramides, polysulfides, polysulfones, polyphenylenes, and polyphenyl ethers, polyurethane (PU), epoxy, polyolefins (e.g. polypropylene, polymethylpentene, and cyclic olefins), acrylonitrile-butadiene-styrene copolymer (ABS), cellulosics, silicones and other silicon-containing polymers (e.g. polysilsesquioxanes and polysilanes), polyvinylchloride (PVC), polyacetates, polynorbornenes, synthetic rubbers (e.g. EPR, SBR, EPDM), and fluoropolymers (e.g., polyvinylidene fluoride, polytetrafluoroethylene (TFE) or polyhexafluoropropylene), copolymers of fluoro-olefin and hydrocarbon olefin (e.g., Lumiflon®), and amorphous fluorocarbon polymers or copolymers (e.g., CYTOP® by Asahi Glass Co., or Teflon® AF by DuPont).

Figure 1F:
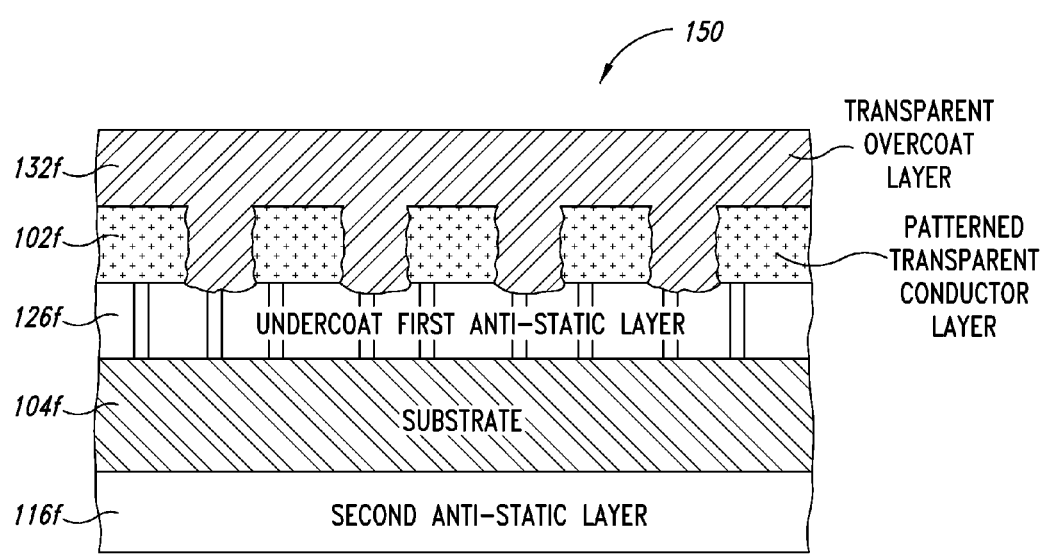

First Anti-Static Layer as an Undercoat+Second Anti-Static Layer on the Opposite Side of the Substrate+Transparent Overcoat Layer (FIG. 1F)

FIG. 1F depicts an implementation similar to that depicted in FIG. 1E, with the addition of an optional second anti-static layer 116f proximate the substrate layer 104f, laterally opposite the undercoat first anti-static layer 126f. FIG. 1F also depicts the transparent overcoat layer 132f that physically seals and isolates the patterned transparent conductor layer 102f from the surrounding ambient environment. Electrostatic discharges may result from charge accumulation in the substrate layer 104f. In such instances, a second anti-static layer 116f disposed proximate the substrate layer 104f may provide sufficient charge dissipation to prevent (or reduce the voltage differential of) an electrostatic discharge by the charge accumulated on the substrate layer 104f and the patterned transparent conductor layer 102f.

Testing Methodology

Figure 2A:
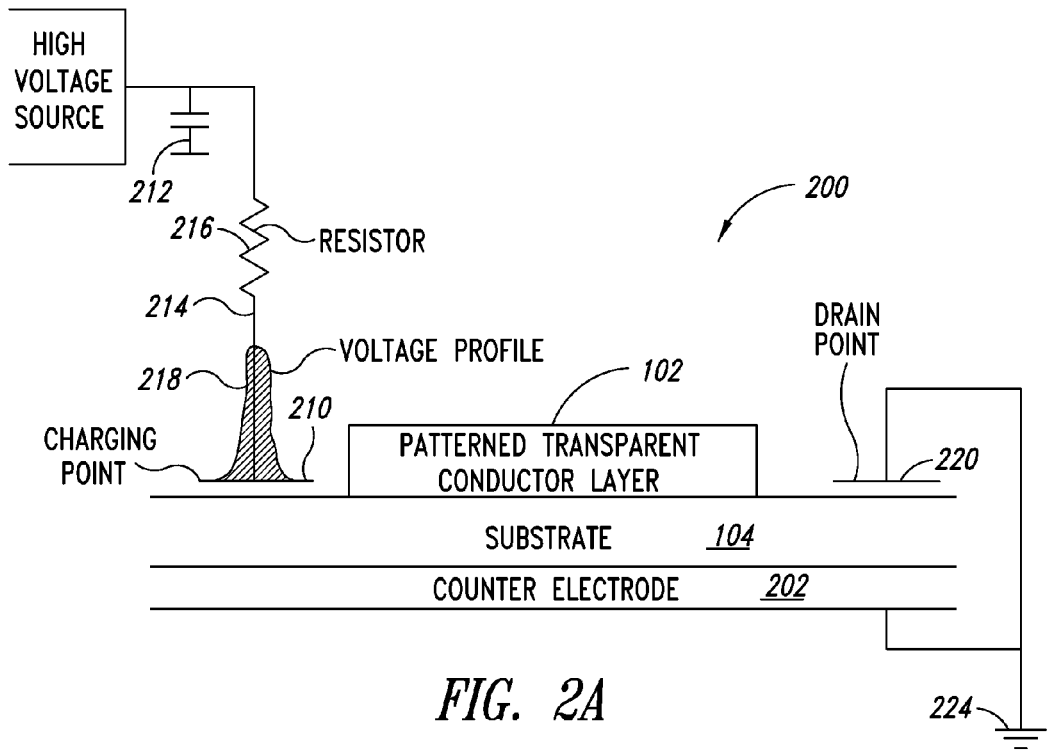
FIG. 2A depicts an optical stack cross-section and electrostatic discharge profile for testing the effects of an electrostatic discharge on an optical stack containing a patterned transparent conductor layer on a non-anti-static substrate, according to an embodiment described herein.

FIG. 2A depicts an illustrative system 200 for testing and/or assessing the effects of an electrostatic discharge on a patterned transparent conductor layer 102 deposited on a non-anti-static substrate 104, such as PET, according to an embodiment. The patterned transparent conductor is deposited onto the non-anti-static substrate 104. A counter electrode 202 lies proximate the non-anti-static substrate 104, laterally opposite the patterned transparent conductor layer 102.

A number of charging point(s) 210 (e.g., one or more electrodes) are positioned at a corresponding number of first locations on a side of the non-anti-static substrate layer 104 occupied by the patterned transparent conductor layer 102. A circuit that includes a charged capacitor 212 and a resistor 216 electrically couples via an electrical probe 214 to each of the number of charging points 210. The capacitor 212 can have a capacitance of about 150 picoFarads (pF) and used to store an electrical charge supplied by a source. The resistor limits the electrical current during the discharge process and can have a resistance of about 1.8 million (or meg) Ohms (M$\Omega$). An electrical probe 214 is used to sequentially electrically connect each one of charging points (210).

A number of drain point(s) 220 (e.g., a number of electrodes) are positioned at a corresponding number of second locations of the side of the non-anti-static substrate layer 104 occupied by the patterned transparent conductor layer 102. Each drain point 220 is electrically connected to the counter electrode 202 and to a grounding point 224. At least a portion of the patterned transparent conductor layer 102 is physically disposed or interposed between the charging point 210 and the drain point 220. By physically interposing the patterned transparent conductor layer 102 at least partially between the charging point(s) 210 and the drain point(s) 220, at least a portion of an electrostatic discharge introduced at the charging point(s) 210 will travel through the patterned transparent conductor layer 102 to reach the drain point(s) 220.

Prior to testing, a charge is placed on the capacitor 212 may be using a high voltage source outputting a known voltage, (e.g., 6 kV, 8 kV, and 10 kV). After connecting the resistor 216 between the charged capacitor and the charging point 210, a charge accumulates at the charging point 210. Due to the high sheet resistance of the substrate, the charge is generally distributed proximate the charge point and thus the voltage at this point with respect to ground is very high, as represented by curve 218. The resulting voltage 218 at the charging point 210 will, in some instances, be sufficient to trigger an electrostatic discharge. In such cases the electrostatic discharge arc transports at least a portion of the charge accumulated at the charging point(s) 210 through the patterned transparent conductor structure 102 where the resulting high electric current has the potential to cause irreversible, (i.e., permanent) damage to the patterned transparent conductor feature.

Figure 2B:
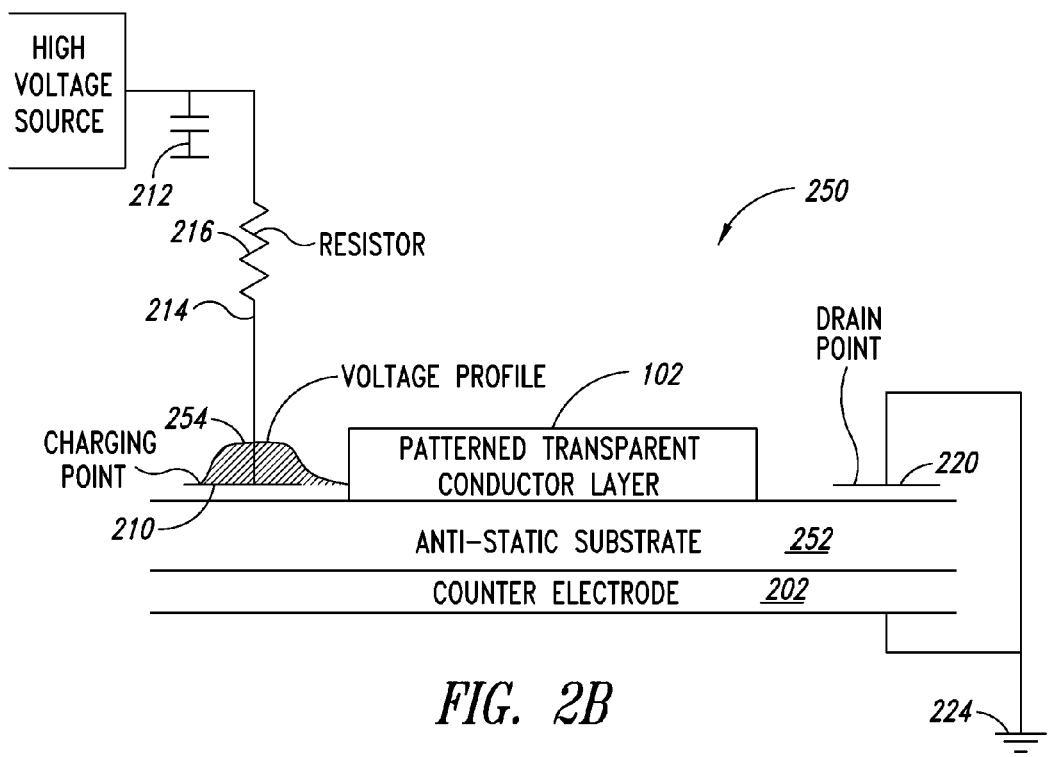
FIG. 2B depicts an optical stack cross-section and electrostatic discharge profile for testing the effects of an electrostatic discharge on an optical stack containing a patterned transparent conductor layer on an anti-static substrate, according to an embodiment described herein.

FIG. 2B depicts an illustrative system 200 for testing and/or assessing the effects of an electrostatic discharge on a patterned transparent conductor layer 102 deposited on an anti-static substrate 252, according to an embodiment. A counter electrode 202 lies proximate the anti-static substrate 252, laterally opposite the patterned transparent conductor layer 102.

Prior to testing, the capacitor 212 was charged with a high voltage to a given voltage, (e.g., 6 kV, 8 kV, 10 kV). In operation, a charge accumulates at the charging point 210 when the probe 214 is brought in contact with the charging point 218. Due to the relatively low sheet resistance of the anti-static substrate 252, the charge diffuses from the charging point 210 and thus the voltage at the charging point 210 represented by curve 218 remains substantially lower than observed with the non-anti-static substrate 104.

During the test, a portion of the charge flows through the patterned transparent conductor 102 since it provides the path of least resistance. Depending on the anti-static capabilities and/or characteristics of the substrate 104, the amount of current through the patterned transparent conductor 102 can be limited to prevent damage to the patterned transparent conductor 102.

Flow Charts

Figure 3:
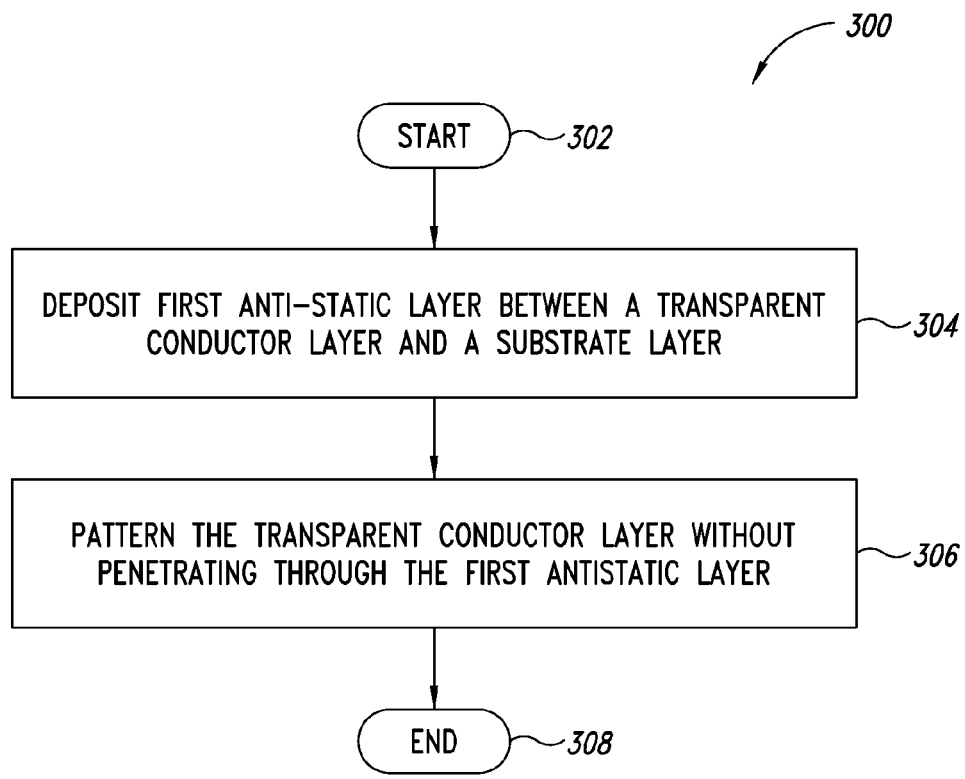
FIG. 3 depicts an illustrative method for limiting electrical charge concentration in an optical stack that includes an anti-static layer, according to an embodiment described herein.

FIG. 3 depicts a high-level flow diagram of an illustrative method 300 for limiting electrical charge concentration in an optical stack that includes a undercoat first anti-static layer 126 disposed between a patterned transparent conductor layer 102 and a substrate layer 104. The presence of an undercoat first anti-static layer 126 in an optical stack 120, 130, 140, 150 can assist in preventing the buildup of an electrostatic charge to levels capable of irreversibly damaging the patterned transparent conductor layer 102. In some implementations, the undercoat first anti-static layer 126 is interposed or otherwise disposed, placed, or positioned between a patterned transparent conductor layer 102 and a substrate layer 104. The patterned transparent conductor layer 102 may be disposed as a continuous transparent conductor that is subsequently patterned by removal of at least a portion of the continuous transparent conductor using laser patterning or similar techniques. In such instances, the technique used to remove portions of the continuous transparent conductor should permit sufficient undercoat first anti-static layer 126 to remain to provide a physically and electrically continuous undercoat first anti-static layer 126 between the patterned transparent conductor layer 102 and the substrate 104. The method 300 for limiting electrical charge concentration in an optical stack that includes an undercoat first anti-static layer 126 disposed between a patterned transparent conductor layer 102 and a substrate layer 104 commences at 302.

At 304, an undercoat first anti-static layer 126 is deposited between a substrate layer 104 and a transparent conductor layer 102. The transparent conductor layer can be either continuous (e.g., a continuous film) or patterned (e.g., deposited as a printed pattern or patterned by any current or future developed patterning methods) across all or a portion of the undercoat first anti-static layer 126. The deposition of the undercoat first anti-static layer 126 may be performed continuously, for example using a flexible substrate such as PET in a roll-to-roll production system. The deposition of the first anti-static layer 106 may be performed semi-continuously (e.g., on a number of rigid substrates fed individually into a deposition chamber or printer) or batch (e.g., on manually loaded rigid substrates). The undercoat first anti-static layer 126 and the transparent conductor layers may be deposited using any current or future developed deposition technique. The thickness of the undercoat first anti-static layer 126 can be about 50 nanometers (nm) to about 100 microns (μm); about 100 nm to about 80 μm; or about 150 nm to about 50 μm.

The undercoat first anti-static layer 126 may have one or more defined electrical properties. The undercoat first anti-static layer 126 may have an in-plane or in-layer sheet resistance of from about $10^6$ ohms per square ($\Omega$/sq) to about $10^9$ $\Omega$/sq.

At 306, if the transparent conductor layer has been applied as a continuous or semi-continuous (i.e., non-patterned) layer, the transparent conductor layer is patterned to provide the patterned transparent conductor layer 102. The patterning technique may include any current or future developed patterning technique, such as laser ablation, however the technique used to pattern the transparent conductor layer should cause minimal, or ideally no, disruption to the undercoat first anti-static layer 126 to facilitate charge dissipation/distribution throughout all or a portion of the first anti-static layer 106. The method 300 for limiting electrical charge concentration in an optical stack that includes undercoat first anti-static layer 126 disposed between a patterned transparent conductor layer 102 and a substrate layer 104 concludes at 308.

Figure 4:
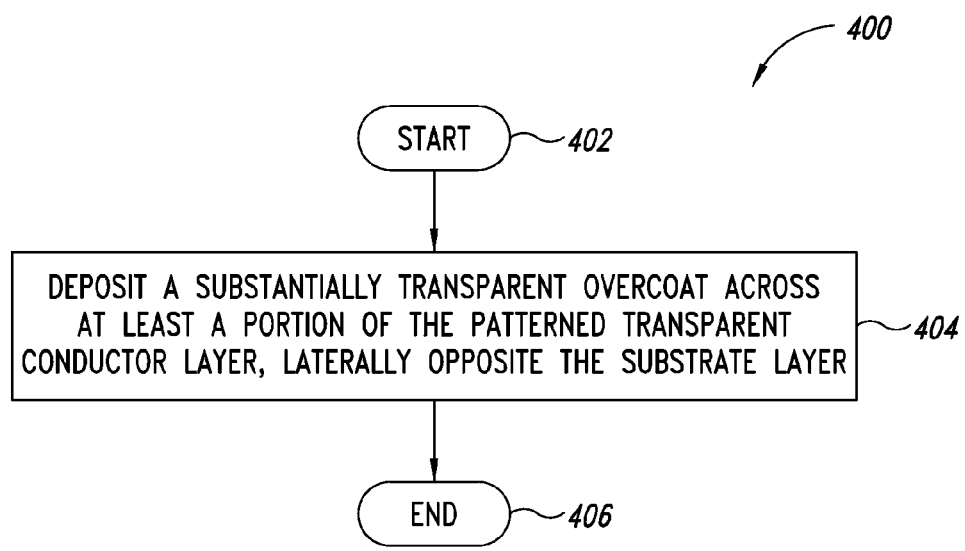
FIG. 4 depicts an illustrative method for limiting electrical charge concentration in the optical stack of FIG. 3 that additionally includes an overcoat layer, according to an embodiment described herein.

FIG. 4 depicts a high-level flow diagram of an illustrative method 400 for overcoating an electrostatic discharge protected optical stack 120, 130. The optical stack 120, 130, 140, 150 may include a substrate layer 104, an undercoat first anti-static layer 126 disposed proximate the substrate layer and a patterned transparent conductor layer 102 disposed proximate the undercoat first anti-static layer 126, laterally opposite the substrate layer 104.

While the patterned transparent conductor layer 102 is reasonably robust, damage to the patterned transparent conductor layer 102 may result in at least a portion (e.g., sections, segments, lines, or other individual conductive elements) of the layer becoming electrically isolated or non-conductive, thereby irreparably damaging the patterned transparent conductor layer 102. To protect and seal the patterned transparent conductor layer 102 from external damage or environmental contamination, a transparent overcoat layer 132 may be disposed proximate the patterned transparent conductor layer 102, laterally opposite the undercoat first anti-static layer 126. In some implementations, the transparent overcoat layer 132 may itself be an anti-static layer or may contain one or more anti-static additives or adjuncts. The method 400 for overcoating an electrostatic discharge protected optical stack commences at 402.

At 404, a transparent overcoat layer 132 is disposed proximate the patterned transparent conductor layer 102, laterally opposite the undercoat first anti-static layer 126 to protect and seal the patterned transparent conductor layer 102 from external damage or environmental contamination. In some instances, the transparent overcoat layer 132 may function as a smoothing layer that planarizes or otherwise levels the relatively uneven surface created by the deposition of the patterned transparent conductor layer 102 over the undercoat first anti-static layer 126. In some instances, the transparent overcoat layer 132 may include one or more anti-static agents, materials, or adjuncts. The thickness of the transparent overcoat layer 132 can be about 50 nanometers (nm) to about 100 microns (μm); about 100 nm to about 80 μm; or about 150 nm to about 50 μm. The method 400 for overcoating an electrostatic discharge protected optical stack 120, 130, 140, 150 concludes at 406.

Figure 5:
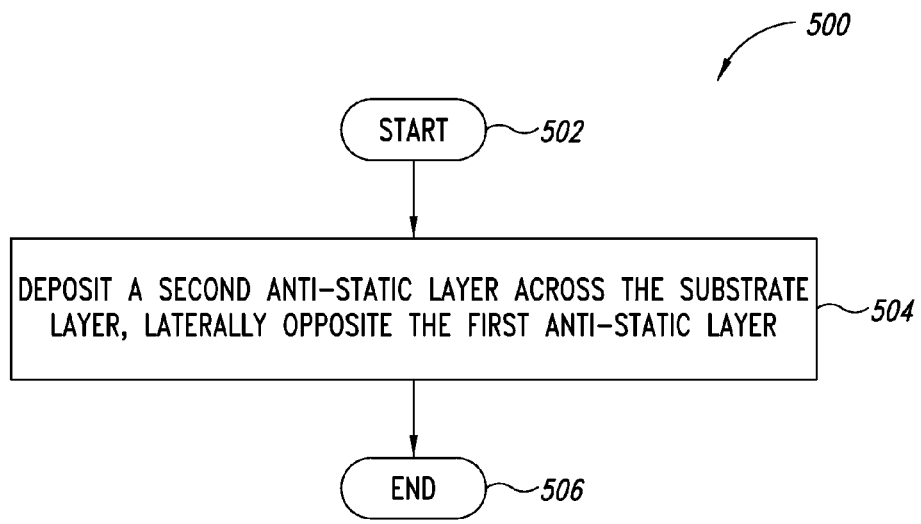
FIG. 5 depicts an illustrative method for limiting electrical charge concentration in an optical stack similar to that depicted in FIG. 3 modified to include a plurality of anti-static layers, according to an embodiment described herein.

FIG. 5 depicts a high-level flow diagram of an illustrative method 500 for depositing a second anti-static layer 116 proximate the substrate layer 104 of an electrostatic discharge protected optical stack 130, 150. The optical stack 130 includes a substrate layer 104, an undercoat first anti-static layer 126 disposed proximate the substrate layer 104 and a patterned transparent conductor layer 102 disposed proximate the undercoat first anti-static layer 126, laterally opposite the substrate layer 104. The second anti-static layer 116 is deposited on the substrate layer 104, laterally opposite the undercoat first anti-static layer 126.

Applying a thick layer, such as the undercoat first anti-static layer 126, to one side of the substrate layer 104 tends to cause the substrate layer 104 to curl due to post-cooling shrinkage of the undercoat first anti-static layer 126. Such curling may be minimized or even eliminated by applying a similar second anti-static layer 116 (i.e., similar to the undercoat first anti-static layer 126) to the side of the substrate layer 104 laterally opposite the undercoat first anti-static layer 126.

In addition to reducing the tendency of the substrate layer 104 to curl, the second anti-static layer 116 also beneficially assists in the speed with which charges dissipate on the opposing side of the substrate layer 104. In other words, the presence of the second anti-static layer 116 will advantageously provide a positive effect on charge migration on the side of the substrate layer 104 containing the patterned transparent conductor layer 102, thereby reducing the maximum attained voltage during the charge accumulation process. Additionally, localized charges on the side of the substrate layer 104 occupied by the patterned transparent conductor layer 102 will often require a complimentary counter-charge on the side of the substrate layer 104 laterally opposite the patterned transparent conductor layer 102. The second anti-static layer 116 promotes an even distribution or dispersal of the counter-charge on the side of the substrate layer 104 laterally opposite the patterned transparent conductor layer 102. The method 500 for depositing a second anti-static layer 116 proximate the substrate layer 104 of an electrostatic discharge protected optical stack 130 commences at 502.

At 504, a second anti-static layer 116 is disposed proximate a side of the substrate layer 104 laterally opposed to the side of the substrate layer 104 containing the undercoat first anti-static layer 126. The second anti-static layer 116 may have the same or different composition as the undercoat first anti-static layer 126. The second anti-static layer 116 may have the same or different thickness as the undercoat first anti-static layer 126. The thickness of the second anti-static layer 116 can be about 50 nanometers (nm) to about 100 microns (μm); about 100 nm to about 80 μm; or about 150 nm to about 50 μm. The method 500 for depositing a second anti-static layer 116 proximate the substrate layer 104 of an electrostatic discharge protected optical stack 130, 150 concludes at 506.

Figure 6:
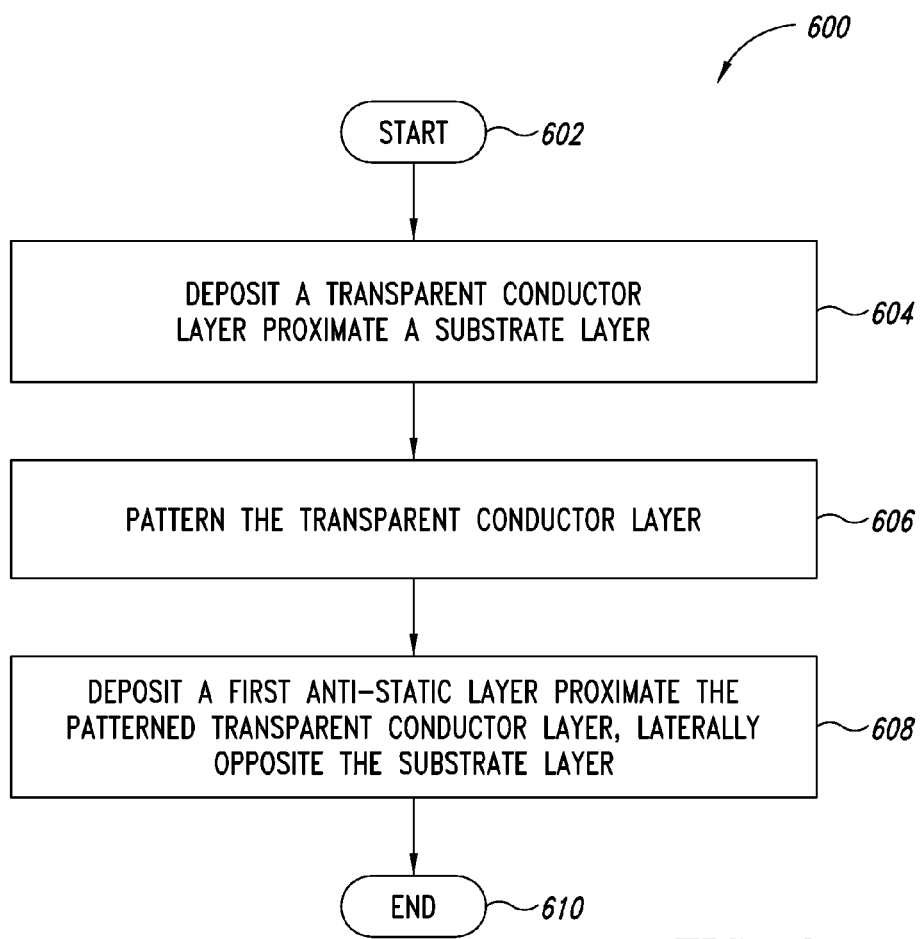
FIG. 6 depicts an illustrative method for limiting electrical charge concentration in another optical stack that includes an anti-static layer, according to an embodiment described herein.

FIG. 6 depicts a high-level flow diagram of an illustrative method 600 for limiting electrical charge concentration in an optical stack 100, 110. The optical stack 100, 110 includes a patterned transparent conductor layer 102 disposed between a substrate layer 104 and an overcoat first anti-static layer 106. The use of an overcoat first anti-static layer 106 in an optical stack assists in preventing the buildup of electrostatic charges capable of irreversibly damaging the patterned transparent conductor layer 102. In some implementations, the patterned transparent conductor layer 102 is interposed or otherwise disposed, placed, or positioned between a substrate layer 104 and the overcoat first anti-static layer 106.

At times, the patterned transparent conductor layer 102 may be disposed as a continuous transparent conductor that is subsequently patterned by removal of at least a portion of the continuous transparent conductor using laser ablation or similar techniques. After patterning the patterned transparent conductor layer 102, the overcoat first anti-static layer 106 may be deposited proximate the patterned transparent conductor layer 102, laterally opposite the substrate layer 104. At other times, the patterned transparent conductor layer 102 may be deposited directly on the substrate layer 104 as a final pattern. The method 600 for limiting electrical charge concentration in an optical stack 100, 110 commences at 602.

At 604, a transparent conductor layer is deposited proximate a substrate layer 104. The transparent conductor layer can be either continuous (e.g., a continuous film) or patterned (e.g., deposited as a printed pattern) across all or a portion of the substrate layer 104. The deposition of the transparent conductor layer may be performed continuously, for example using a flexible substrate such as PET in a roll-to-roll production system. The deposition of the transparent conductor layer may be performed semi-continuously (e.g., on a number of rigid substrates fed individually into a deposition chamber or printer) or batch (e.g., on manually loaded rigid substrates). The transparent conductor layer may be deposited using any current or future developed deposition technique.

At 606, the transparent conductor layer is patterned if the transparent conductor layer was deposited as a non-patterned layer at 604. Patterning the transparent conductor layer produces a patterned transparent conductor layer 102 proximate the substrate layer 104. Any current or future developed patterning technique, such as laser ablation, may be used to produce any desired conductor pattern in the patterned transparent conductor layer 102. If the transparent conductor layer is deposited as a patterned transparent conductor layer 102 at 604, then the patterning at 606 may optionally be omitted.

At 608, an overcoat first anti-static layer 106 is deposited proximate the patterned transparent conductor layer 102, laterally opposite the substrate layer 104. The deposition of the overcoat first anti-static layer 106 may be performed continuously, for example using a flexible substrate such as PET in a roll-to-roll production system. The deposition of the overcoat first anti-static layer 106 may be performed semi-continuously (e.g., on a number of rigid substrates fed individually into a deposition chamber or printer) or batch (e.g., on manually loaded rigid substrates). The overcoat first anti-static layer 106 may be deposited using any current or future developed deposition technique. The thickness of the overcoat first anti-static layer 106 can be about 50 nanometers (nm) to about 100 microns (μm); about 100 nm to about 80 μm; or about 150 nm to about 50 μm. The method 600 for limiting electrical charge concentration in an optical stack 100, 110 concludes at 610.

Figure 7:
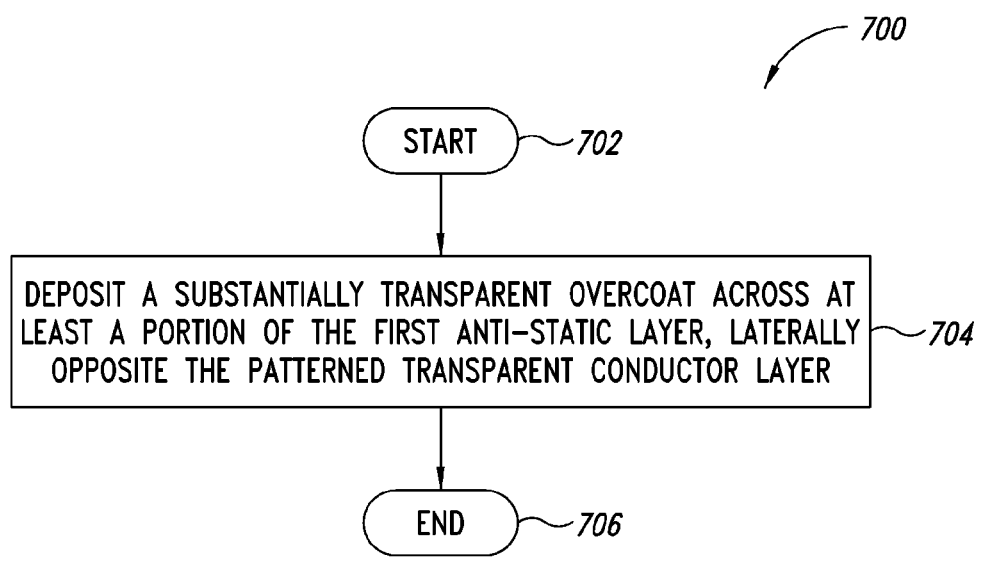
FIG. 7 depicts an illustrative method for limiting electrical charge concentration in the optical stack of FIG. 6 that additionally includes an overcoat layer, according to an embodiment described herein.

FIG. 7 depicts a high-level flow diagram of an illustrative method 700 for overcoating an electrostatic discharge protected optical stack 100, 110. The optical stack 100, 110 may include a substrate layer 104, a patterned transparent conductor layer 102 disposed proximate the substrate layer and an overcoat first anti-static layer 106 disposed proximate the patterned transparent conductor layer 102, laterally opposite the substrate layer 104.

To protect and seal the overcoat first anti-static layer 106 from external damage or environmental contamination, a transparent overcoat layer 132 may be disposed proximate the overcoat first anti-static layer 106, laterally opposite the patterned transparent conductor layer 102. The method 700 for overcoating an electrostatic discharge protected optical stack commences at 702.

At 704, a transparent overcoat layer 132 is disposed proximate the overcoat first anti-static layer 106, laterally opposite the patterned transparent conductor layer 102 to protect and seal the overcoat first anti-static layer 106 from external damage or environmental contamination. The thickness of the transparent overcoat layer 132 can be about 50 nanometers (nm) to about 100 microns (μm); about 100 nm to about 80 μm; or about 150 nm to about 50 μm. The method 700 for overcoating an electrostatic discharge protected optical stack concludes at 706.

Figure 8:
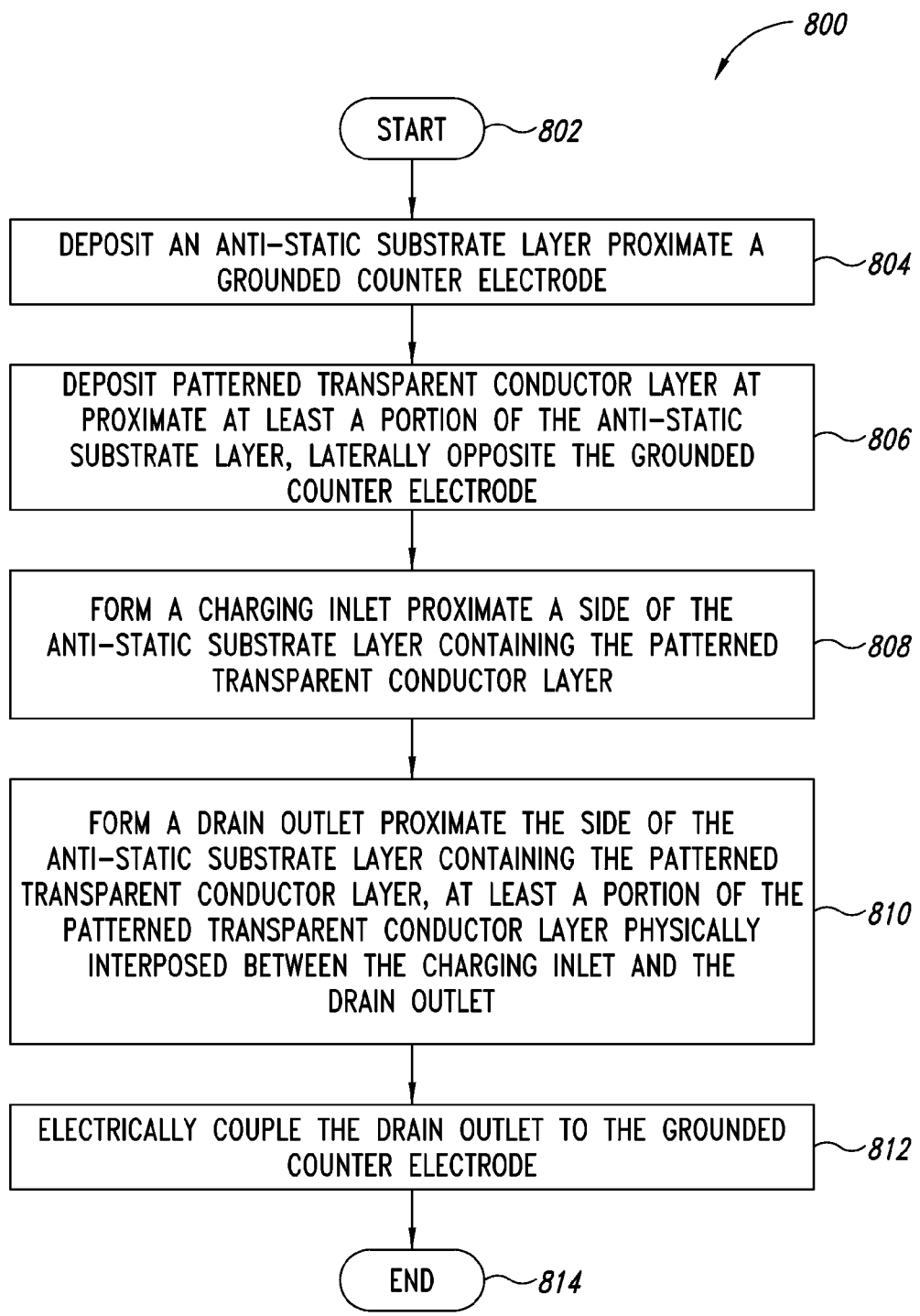
FIG. 8 depicts an illustrative method for providing a test apparatus suitable for assessing the effects of electrostatic discharge on an optical stack including a patterned transparent conductor, according to an embodiment described herein.

FIG. 8 depicts a high-level, illustrative, method 800 for producing a test apparatus suitable for determining the effects of an electrostatic discharge on a patterned transparent conductor layer 102 in an optical stack. To evaluate the effect of an electrostatic discharge on a patterned transparent conductor layer 102 under controlled circumstances, a patterned transparent conductor layer 102 having a reproducible, defined, pattern is deposited on a conventional (i.e., non-anti-static) substrate 104 to provide a control sample and on an anti-static substrate 252 to provide a test sample. Identical patterned transparent conductor layers 102 are deposited on the conventional substrate 104 and the anti-static substrate 252. An electrostatic discharge is passed through the patterned transparent conductor layers 102 and damage to the patterned transparent conductor layer 102 on the conventional substrate 104 is compared to damage to the patterned transparent conductor layer 102 on the anti-static substrate 252. The method 800 of producing a test apparatus suitable for determining the effects of an electrostatic discharge on a patterned transparent conductor layer 102 in an optical stack commences at 802.

At 804, a counter electrode 202 is deposited on an anti-static substrate layer 252. In some instances, the counter electrode 202 may include an aluminum or similarly conductive metal plate. In other instances, the counter electrode 202 may include a layer that includes a material or combination of materials having a sheet resistance of less than $10^6$ ohms per square (Ω/sq) deposited on an anti-static substrate layer 252. The counter electrode 202 is grounded via one or more grounding points 224.

At 806, a patterned transparent conductor layer 102 having a reproducible and defined pattern is deposited on at least a portion of an anti-static substrate layer 252, laterally opposite the counter electrode 202. The pattern can include any number of conductors, conductor shape, and/or conductor density. For example, the pattern may include twenty parallel conductive lines or traces, each one millimeter wide by 25 millimeters long.

At 808, charging inlet(s) 210 are deposited at one or more first locations on the side of the anti-static substrate layer 252 containing the patterned transparent conductor layer 102. The charging inlet(s) 210 provide the charge accumulation point for the electrostatic discharge produced by the electrostatic discharge device 212. Any number of charging inlet(s) may be deposited one the anti-static substrate layer 252. In one example, a single charging inlet 210 may be disposed physically close, but not contacting, all of the conductors or conductive elements forming the patterned transparent conductor layer 102. In another example, an individual charging point 210 may be disposed physically close, but not contacting, a respective one of the conductive structures or conductive elements forming the patterned transparent conductor layer 102. The charging inlets 210 may be disposed using any current or future developed deposition technique including manual techniques (e.g., placing "dots" of conductive ink on the anti-static substrate layer 252).

At 810, drain outlet(s) 220 are deposited at one or more second locations on the side of the anti-static substrate layer 252 containing the patterned transparent conductor layer 102. The drain outlet(s) 220 are disposed relative to the charging inlet(s) 210 such that at least a portion of the patterned transparent conductor layer 102 is physically located between the charging inlet(s) 210 and the drain outlet(s) 220.

The drain outlet(s) 220 provide the charge drain point to remove or conduct the electrostatic discharge from the optical stack 200, 250 to ground. Any number of charging inlet(s) may be deposited one the anti-static substrate layer 252. In one example, a single drain outlet 220 may be disposed physically close, but not contacting, all of the conductors or conductive elements forming the patterned transparent conductor layer 102. In another example, individual drain outlet(s) 220 may be disposed physically close, but not contacting, a respective one of the conductive structures or conductive elements forming the patterned transparent conductor layer 102. The drain outlet(s) 220 may be disposed using any current or future developed deposition technique including manual techniques (e.g., placing "dots" or "stripes" of conductive ink on the conventional or anti-static substrate layer 104, 252).

At 812, some or all of the drain outlet(s) 220 may be electrically conductively coupled to the counter electrode 202 and/or grounding point 224. The method 800 of producing a test apparatus suitable for determining the effects of an electrostatic discharge on a patterned transparent conductor layer 102 in an optical stack concludes at 814.

Figure 9:
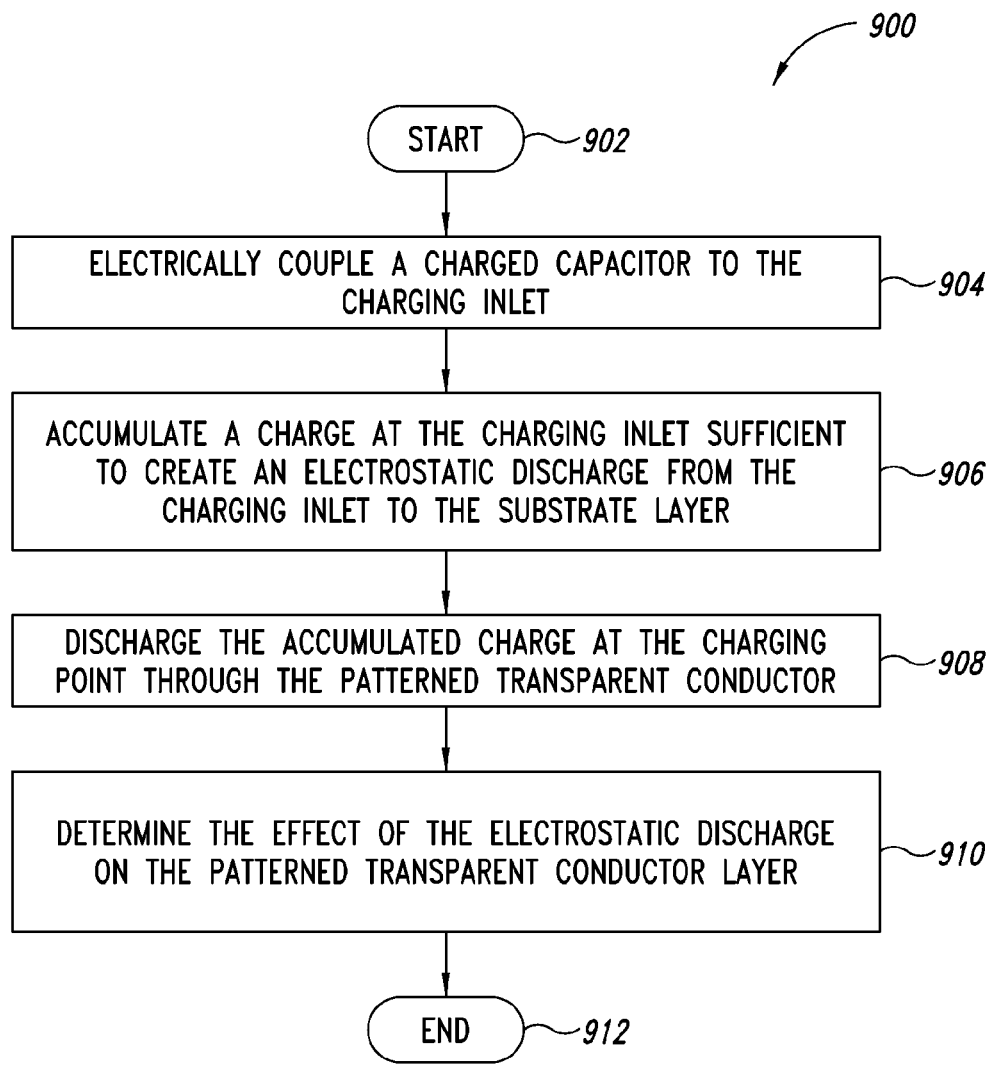
FIG. 9 depicts an illustrative method for assessing the effects of electrostatic discharge on an optical stack including a patterned transparent conductor, according to an embodiment described herein.

FIG. 9 depicts a high-level, illustrative, method 900 for assessing the effects of an electrostatic discharge on a patterned transparent conductor layer 102 in an optical stack, according to one illustrated embodiment. Using the test assemblies 200, 250 depicted in FIGS. 2A and 2B and assembled per the method of FIG. 8, a capacitor 212 charged to a sufficiently high voltage (e.g., 6 kV, 8 kV, 10 kV) is permitted to discharge through a resistance 216 through an electrical probe 214 that permits a charge to accumulate at the charging point 210. The charge accumulated at the charging point discharges or otherwise dissipates through the anti-static layer or through the patterned transparent conductor layer 102. Differences in the damage suffered by the patterned transparent conductor layers 102 on each substrate compared and a qualitative assessment of the ability of an anti-static substrate to protect the patterned transparent conductor layer 102 is made. The method 900 of assessing the effects of an electrostatic discharge on a patterned transparent conductor layer 102 in an optical stack 200, 250 commences at 902.

At 904, a capacitor 212 charged to a voltage capable of producing an electrostatic discharge (e.g., 6 kV, 8 kV, 10 kV) is sequentially electrically conductively coupled to each of the charging inlet(s) 210 via an electrical probe 214. In some instances, one or more resistances or impedances 216 may be electrically conductively coupled between the capacitor 212 and the charging point 210. The one or more resistances or impedances may have any resistance or impedance value such as 250,000 Ohms (250 kΩ) or more; 500,000 Ohms (500 kΩ) or more; 1,000,000 Ohms (1 MΩ) or more; 1,500,000 Ohms (1.5 MΩ) or more; or 2,000,000 Ohms (2 MΩ) or more.

At 906, the charged capacitor 212 discharges through the resistor 216 thereby permitting the accumulation of an electrical charge at the charging inlet 210.

At 908, the charge accumulated at the charging inlet(s) 210 dissipates or diffuses through the anti-static substrate 252 and/or through the patterned transparent conductor layer 102. The anti-static substrate 252 limits the voltage profile 254 at the charging point 210 of optical stack 250 to a voltage level that is significantly lower than the voltage profile 218 at the charging point 210 of optical stack 200. The lower voltage level in optical stack 250 is attributable to charge leakage from the charging point 210 through the anti-static substrate 252 and/or through the patterned transparent conductor layer 102 to ground. Advantageously, the lower voltage level at the charging point 210 in optical stack 250 is less likely to cause damage to the patterned transparent conductor 102 than the higher voltage levels experienced at the charging point 210 in the optical stack 200 that includes a non-anti-static substrate 104.

At 910, after discharging the accumulated charge to the conventional substrate layer 104 and to the anti-static substrate layer 252, the patterned transparent conductor layers 102 deposited on the conventional substrate layer 104 and the anti-static substrate layer 252 are compared. In one instance, the conductivity of the conductors or conductive elements forming the patterned transparent conductor layer 102 on each substrate layer 104, 252 are assessed and the number of non-conductive or reduced conductivity conductors or conductive elements tabulated.

Comparing the number of non-conductive or reduced conductivity conductors or conductive elements deposited on the conventional substrate 104 with the number of non-conductive or reduced conductivity conductors or conductive elements deposited on the anti-static substrate layer 252 can provide a qualitative assessment of whether the use of an anti-static substrate 252 and/or anti-static layers 106, 116, 126 will protect the patterned transparent conductor layer 102 in the event of an electrostatic discharge. The method 900 of assessing the effects of an electrostatic discharge on a patterned transparent conductor layer 102 in an optical stack 200, 250 concludes at 912.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet including U.S. Provisional Application Ser. No. 61/823,833, filed May 15, 2013, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of assessing the effects of electrostatic discharge on a patterned transparent conductor, the method comprising:
  depositing an anti-static substrate layer proximate at least a portion of a grounded counter electrode;
  depositing a patterned transparent conductor layer at least partially across and proximate the anti-static substrate layer laterally opposite the grounded counter electrode;
  disposing a charging inlet proximate the anti-static substrate layer at a first location on a side of the anti-static substrate layer including the patterned transparent conductor layer, the first location not in direct physical contact with either the patterned transparent conductor or the anti-static substrate layer;
  disposing a drain outlet proximate the anti-static substrate layer at a second location on the side of the anti-static substrate layer including the patterned transparent conductor layer, the second location not in direct physical contact with either the patterned transparent conductor or a second surface of the anti-static substrate layer and at least a portion of the patterned transparent conductor between the first location and the second location; and
  electrically coupling the drain outlet to the grounded counter electrode.

2. The method of claim 1, further comprising:
  electrically coupling a charged capacitor to the charging inlet; and
  accumulating an electrical charge at the charging inlet;
  dissipating the accumulated electrical charge at the charging inlet through at least one of either the anti-static substrate layer or patterned transparent conductor layer; and
  determining the electrical conductivity of all or a portion of the patterned transparent conductor layer.

3. The method of claim 2 wherein electrostatically discharging the accumulated electrical charge at the charging inlet to the anti-static substrate layer comprises:
  discharging the charged capacitor through a first external resistor placed in series with the charging inlet.

4. The method of claim 3 wherein discharging the charged capacitor through a first external resistor placed in series with the charging inlet comprises:
  discharging the charged capacitor through the first external resistor, the first external resistor including at least one resistance value of one million ohms (1 MΩ) or greater.

5. The method of claim 4 wherein depositing a patterned transparent conductor layer at least partially across and proximate the anti-static substrate layer comprises:
  depositing the patterned transparent conductor layer at least partially across and proximate a polyethylene terephthalate (PET) substrate layer that includes at least one of: one or more anti-static materials disposed within the substrate layer or one or more anti-static layers disposed proximate the anti-static substrate layer.

* * * * *